United States Patent
Gadat et al.

(10) Patent No.: US 11,909,416 B2
(45) Date of Patent: Feb. 20, 2024

(54) DEVICE AND METHOD FOR EFFICIENTLY ENCODING QUASI-CYCLIC LDPC CODES

(71) Applicant: AIRBUS DEFENCE AND SPACE SAS, Toulouse (FR)

(72) Inventors: Benjamin Gadat, Toulouse (FR); Lyonel Barthe, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 18/018,224

(22) PCT Filed: Jul. 19, 2021

(86) PCT No.: PCT/FR2021/051347
§ 371 (c)(1),
(2) Date: Jan. 26, 2023

(87) PCT Pub. No.: WO2022/023641
PCT Pub. Date: Feb. 3, 2022

(65) Prior Publication Data
US 2023/0231576 A1    Jul. 20, 2023

(30) Foreign Application Priority Data

Jul. 31, 2020 (FR) .................... 20 08173

(51) Int. Cl.
*H03M 13/00* (2006.01)
*H03M 13/11* (2006.01)

(52) U.S. Cl.
CPC ........ *H03M 13/116* (2013.01); *H03M 13/611* (2013.01)

(58) Field of Classification Search
CPC .................. H03M 13/116; H03M 13/611
See application file for complete search history.

(56) References Cited

U.S. PATENT DOCUMENTS

2009/0083604 A1* 3/2009 Tong ................ H03M 13/1148
714/752
2011/0264987 A1  10/2011 Li et al.
(Continued)

OTHER PUBLICATIONS

Mohanad Alfiras et al., "Hybrid Concatenated LDPC Codes with LTE Modulation Schemes", (IJACSA) International Journal of Advanced Computer Science and Applications, vol. 10, No. 5, Jan. 1, 2019, pp. 498-502, retrieved from the Internet: <https://pdfs.semanticscholar.org/7040/3ba4733a6c3ac38bf9d87d2f9d07b980f2f9.pdf>.

(Continued)

*Primary Examiner* — Samir W Rizk
(74) *Attorney, Agent, or Firm* — Nixon & Vanderhye P.C.

(57) ABSTRACT

A data encoding device suitable for encoding a plurality of LDPC codes is disclosed including an input interface and an output interface, and a first circuit for encoding quasi-cyclic LDPC code, connected at an input to the input interface and at an output to the input of a first multiplexer circuit, a second circuit for encoding quasi-cyclic LDPC code, connected at an input to the input interface and at an output to the input of the first multiplexer circuit, a third circuit for (Continued)

Figure 1:
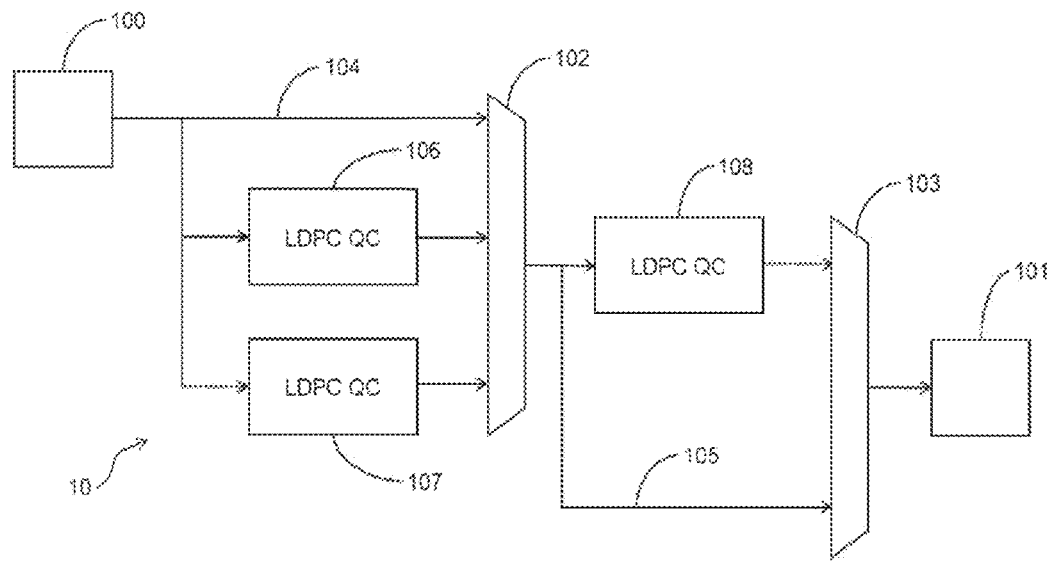

encoding quasi-cyclic LDPC code, connected at an input to the output of the first multiplexer circuit and at an output to the input of a second multiplexer circuit.

15 Claims, 5 Drawing Sheets

(56) References Cited

U.S. PATENT DOCUMENTS

2016/0154697 A1* 6/2016 Teitel ............... H03M 13/1148
                                                               714/766
2017/0163288 A1* 6/2017 Tate .................... G06F 11/0727

OTHER PUBLICATIONS

Christian Koller et al., "Hybrid Concatenated Codes with Asymptotically Good Distance Growth", 2008 5$^{th}$ International Symposium on Turbo Codes and Related Topics, IEEE, Sep. 1, 2008, pp. 19-24.

Yifei Zhang et al., "Structured eIRA Codes with Low Floors", Proc. International Symposium on Information Theory 2005 (ISIT 2005), Adelaide, Australia, Sep. 4-9, 2005, pp. 174-178.
Dimitris Theodoropoulos et al., "Efficient Architectures for Multigigabit CCSDS LDPC Encoders", IEEE Transactions on Very Large Scale Integration (VLSI) Systems, vol. 28, No. 5, Mar. 2, 2020, pp. 1118-1127.
Liang Chen et al., "Implementation of Multi-Rate Quasi-Cyclic Low-Density Parity-Check Codes", The 9$^{th}$ International Conference on Advanced Communication Technology, vol. 2, Jan. 1, 2007, pp. 1066-1070.
Marc P. C. Fossorier, "Quasi-Cyclic Low-Density Parity-Check Codes From Circulant Permutation Matrices", IEEE Transactions on Information Theory, vol. 50, No. 8, Aug. 2004, pp. 1788-1793.
Thomas J. Richardson et al., "Design of Capacity-Approaching Irregular Low-Density Parity-Check Codes", IEEE Transactions on Information Theory, vol. 47, No. 2, Feb. 2001, pp. 619-637.
International Search Report with English Translation for PCT/FR2021/051347, eight pages, dated Oct. 28, 2021.
Written Opinion of the ISA for PCT/FR2021/051347, eight pages, dated Oct. 28, 2021.

* cited by examiner

DEVICE AND METHOD FOR EFFICIENTLY ENCODING QUASI-CYCLIC LDPC CODES

CROSS REFERENCE TO RELATED APPLICATIONS

The present application is a National Phase of International Application Number PCT/FR2021/051347 filed Jul. 19, 2021, which designated the U.S. and claims priority benefits from French Application Number FR 20 08173 filed Jul. 31, 2020, the entire contents of each of which are hereby incorporated by reference.

TECHNICAL FIELD

This invention lies within the field of digital communications, and relates more particularly to a device and a method for encoding low-density parity-check codes, known as LDPC codes.

PRIOR ART

LDPC codes are increasingly widespread in terrestrial and satellite communication systems.

For example, the 5G communication standard defined by ETSI (European Telecommunication Standards Institute) incorporates LDPC codes. Also, the DVB-S2 ("Digital Video Broadcasting—Satellite—Second Generation") standard for video broadcasting by satellite incorporates LDPC codes.

Currently, the CCSDS ("Consultative Committee for Space Data Systems"), which brings together the main space agencies around the globe, is in the process of defining a communication standard for which LDPC codes have been defined by the AIRBUS DEFENCE AND SPACE company and proposed by the Centre National d'Etudes Spatiales (CNES). The envisaged transmission rate, of around 10 Gbit/s, would allow observation satellites to quickly transmit a large amount of observation data to the ground.

The communication standard currently being defined by the CCSDS is designed to include a plurality of different LDPC codes, making it possible to adapt the LDPC code used to the transmission conditions and/or to the amount of data to be transmitted. In particular, several code rates are envisaged for the LDPC codes. Using LDPC codes of different types is also envisaged. In particular, the intent is to use a first type of LDPC codes for the lowest code rates and to use a second type of LDPC codes for the highest code rates.

However, such flexibility in terms of code rate and type of LDPC code, coupled with a high transmission rate, is particularly complex to achieve. Especially in the case of an encoding device to be embedded in a satellite, for which the computing components that can be used, i.e. that are approved for space flight, are few and generally have lower performance than computing components that can be used on the ground.

There is therefore a need for an encoding device architecture that allows a flexible implementation of different types of LDPC codes, and is also compatible with high transmission rates. Such an architecture would be of interest in the context of the standard defined by the CCSDS, but also, more generally, for any communication system likely to use different types of LDPC codes.

DISCLOSURE OF THE INVENTION

The present invention aims to remedy all or part of the limitations of the prior art solutions, in particular those set forth above, by proposing a solution which allows implementing different types of LDPC codes in a flexible manner, and which is also compatible with high transmission rates.

To this end, and according to a first aspect, a data encoding device is proposed that is suitable for encoding a plurality of LDPC codes, said encoding device comprising an input interface for receiving data of a data packet to be encoded and an output interface for providing encoded data. Said encoding device comprises:
- a first multiplexer circuit and a second multiplexer circuit, the input of said first multiplexer circuit being connected to the input interface and its output to the input of said second multiplexer circuit, the output of said second multiplexer circuit being connected to the output interface,
- a first encoding circuit for encoding quasi-cyclic LDPC code, its input connected to the input interface and its output to the input of the first multiplexer circuit,
- a second encoding circuit for encoding quasi-cyclic LDPC code, its input connected to the input interface and its output to the input of the first multiplexer circuit, said second encoding circuit being arranged in parallel with said first encoding circuit,
- a third encoding circuit for encoding quasi-cyclic LDPC code, its input connected to the output of the first multiplexer circuit and its output to the input of the second multiplexer circuit.

The encoding device thus comprises three encoding circuits for encoding quasi-cyclic LDPC code. Quasi-cyclic LDPC codes correspond to a general type of LDPC code, well known to those skilled in the art (for example see [Foss]). Quasi-cyclic LDPC codes are known to allow efficient encoding and decoding by the possible parallelization of numerous processing operations, and for which numerous optimized architectures exist. Such quasi-cyclic LDPC codes are therefore particularly suitable for applications aiming for high transmission rates, on the order of several Gbit/s, as is the case in particular for the standard defined by the CCSDS.

Furthermore, many particular types of LDPC codes correspond to quasi-cyclic LDPC codes and/or to juxtapositions and/or combinations of quasi-cyclic LDPC codes. For example, an LDPC code with single parity check, referred to as LDPC SPC code, is a particular type of quasi-cyclic LDPC code. Similarly, an LDPC code with irregular repeated accumulation, referred to as LDPC IRA code, is a particular type of quasi-cyclic LDPC code.

Furthermore, the three encoding circuits for encoding LDPC code include:
- a first encoding circuit for encoding LDPC code and a second encoding circuit for encoding LDPC code, arranged in parallel, making it possible to produce LDPC codes juxtaposing quasi-cyclic LDPC codes; for example the juxtaposition of an LDPC IRA code and an LDPC SPC code makes it possible to obtain an LDPC code with accumulation repetition accumulation, referred to as LDPC ARA code ("Accumulate Repeat Accumulate");
- a third encoding circuit for encoding LDPC code, arranged in series with the first and second encoding circuits for encoding quasi-cyclic LDPC code, which makes it possible to combine quasi-cyclic LDPC codes in series by injecting into the third encoding circuit for encoding quasi-cyclic LDPC code the data encoded by the first and/or the second encoding circuit for encoding LDPC code.

It is therefore understood that such an encoding device architecture makes it possible to form many different types of LDPC codes, by means of suitable configurations of the three encoding circuits for encoding quasi-cyclic LDPC code. Such an architecture makes it possible in particular to form the different types of LDPC codes proposed for the standard currently being defined by the CCSDS, which include:
- LDPC ARA codes juxtaposing LDPC IRA and SPC codes in parallel, for the highest code rates,
- LDPC codes combining LDPC ARA and SPC codes in series (which can be considered to be similar to Raptor codes) for the lowest code rates.

In addition to the fact that quasi-cyclic LDPC codes are particularly suitable for applications aiming for high transmission rates, the architecture of the proposed encoding device also makes it possible to perform many processing operations in parallel.

For example, the first and second encoding circuits for encoding LDPC code can encode data in parallel in order to create a same LDPC code word. In addition, write accesses, whose durations can prove to be critical for transmission rates on the order of Gbit/s, can be highly parallelized. For example, it is possible to write the data to be encoded, in parallel into respective input buffer memories of the three encoding circuits for encoding LDPC code, while writing, into an output buffer memory of the encoding device, data to be included as is in the LDPC code word (systematic bits).

In practice, the inventors have verified that such an encoding device architecture makes it possible to achieve a transmission rate of 10 Gbit/s for LDPC codes combining ARA and SPC codes in series, in accordance with the LDPC codes proposed for the CCSDS standard, by means of a FPGA ("Field-Programmable Gate Array") type of programmable logic device as sold by the Xilinx® Company under the reference KU060.

In some particular embodiments, the encoding device may further comprise one or more of the following features, in isolation or in all technically possible combinations.

In some particular embodiments, the encoding device comprises at least one memory in which is stored configuration information comprising:
- at least one encoding matrix for LDPC IRA code, for configuring the first encoding circuit,
- at least one encoding matrix for LDPC SPC code, for configuring the second encoding circuit,
- at least one encoding matrix for LDPC SPC code, for configuring the third encoding circuit.

In some particular embodiments, at least one encoding matrix for LDPC code is partially stored, by not storing adjacent rows or columns of said encoding matrix for LDPC code which consist of zero values. Such arrangements allow reducing the memory footprint for the configuration of encoding circuits for LDPC codes, and also allow accelerating the encoding by avoiding the loading/unloading of values not used in actual practice.

In some particular embodiments, the third encoding circuit comprises an input buffer memory of a size suitable for storing data corresponding to at least two data packets to be encoded. Such arrangements allow further parallelizing the processing operations, by making it possible to write, to the input buffer memory, data from the next data packet while encoding the data of the current data packet.

In some particular embodiments, the first multiplexer circuit is connected to the second multiplexer circuit via a buffer memory. By means of this buffer memory, writing the LDPC code words to the output interface of the encoding device is more efficient because it can be carried out with blocks of data in burst mode, to optimize use of the output interface bandwidth ("burst accesses").

In some particular embodiments, the buffer memory between the first multiplexer circuit and the second multiplexer circuit is of the first-in-first-out type.

In some particular embodiments, the buffer memory between the first multiplexer circuit and the second multiplexer circuit is of a size suitable for storing data corresponding to at least two data packets to be encoded. Such arrangements allow further parallelizing the processing operations, by making it possible to write, to this buffer memory, data from the next data packet that are to be included as is (systematic bits) while the third encoding circuit for encoding LDPC code encodes data of the current data packet.

In some particular embodiments, the encoding device is configured to encode LDPC codes whose parity matrix H can be put in the following form:

$$H = \begin{pmatrix} A & 0 & D \\ B & E & 0 \end{pmatrix}$$

or in the following form:

$$H = \begin{pmatrix} A & 0 & D & 0 \\ B & E & 0 & 0 \\ C' & C'' & C''' & F \end{pmatrix}$$

expressions in which matrices E and F are diagonal matrices (identity matrices), and matrix D is a dual diagonal matrix. In particular, the LDPC codes proposed for the standard defined by the CCSDS can be expressed in these forms (LDPC ARA code on the one hand, and combination of LPDC ARA and SPC codes in series on the other hand).

In some particular embodiments, the encoding device is further configured to encode LDPC codes whose parity matrix H can be put in the following form:

$$H = (A\ D)$$

According to a second aspect, a satellite is proposed comprising an encoding device according to any one of the embodiments of the invention.

In some particular embodiments of the satellite, the encoded data are transmitted over an optical link and/or the encoded data are transmitted at a rate greater than 5 Gbit/s, for example 10 Gbit/s.

According to a third aspect, a method is proposed for encoding LDPC codes by means of an encoding device according to any one of the embodiments of the invention. The encoding method comprises:
- writing, in parallel, data of a data packet to be encoded, into respective input buffer memories of the first encoding circuit, second encoding circuit, and third encoding circuit,
- encoding, in parallel, data in the input buffer memory, by the first encoding circuit and the second encoding circuit,
- writing data respectively encoded by the first encoding circuit and the second encoding circuit, into the input buffer memory of the third encoding circuit,
- encoding the data in the input buffer memory, by the third encoding circuit.

In some particular modes of implementation, the encoding method may further comprise one or more of the following features, in isolation or in any technically possible combination.

In some particular modes of implementation, the encoding method comprises, in parallel with the encoding by the third encoding circuit, a writing, in parallel, of data of another data packet to be encoded, into the respective input buffer memories of the first encoding circuit, second encoding circuit, and third encoding circuit.

In some particular modes of implementation, the encoding device comprising a buffer memory between the first multiplexer circuit and the second multiplexer circuit, the data of the data packet are written into said buffer memory in parallel with the writing into the respective input buffer memories of the first encoding circuit, second encoding circuit, and third encoding circuit.

According to a fourth aspect, a configuration program product is proposed comprising instructions which, when implemented to configure a programmable logic device, configure said programmable logic device to form an encoding device according to any one of embodiments of the invention. The instructions of the configuration program product are, for example, in high level language (for example VHDL, Verilog, etc.) or in low level language (corresponding to high level language compiled for the programmable logic device concerned).

PRESENTATION OF THE FIGURES

Figure 2:
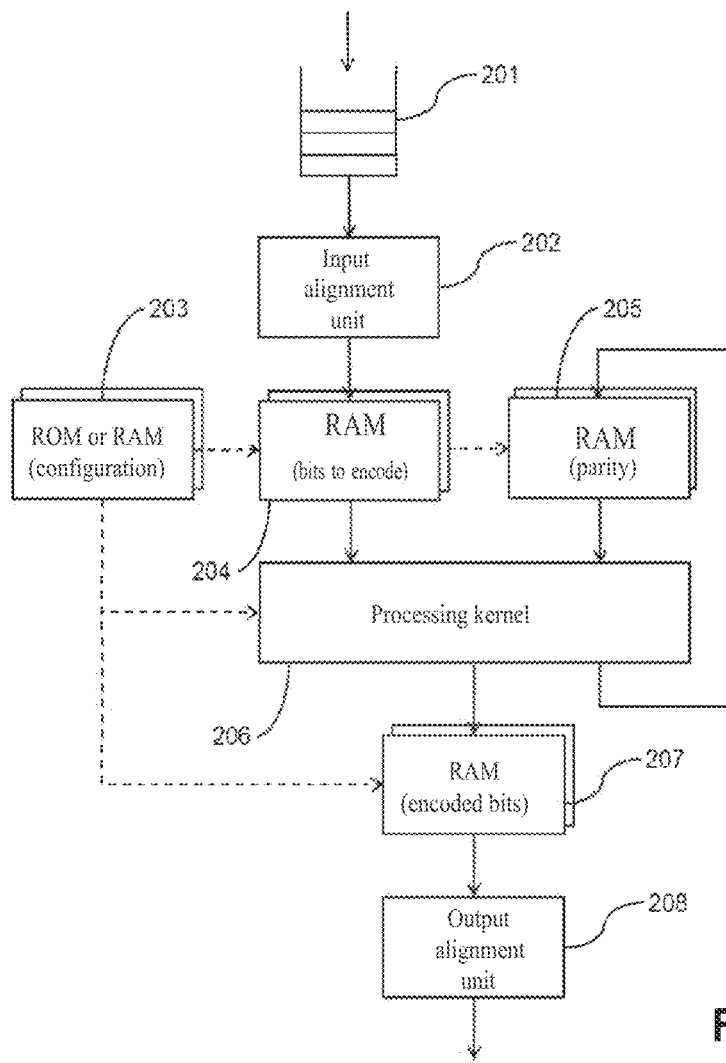
Figure 3:
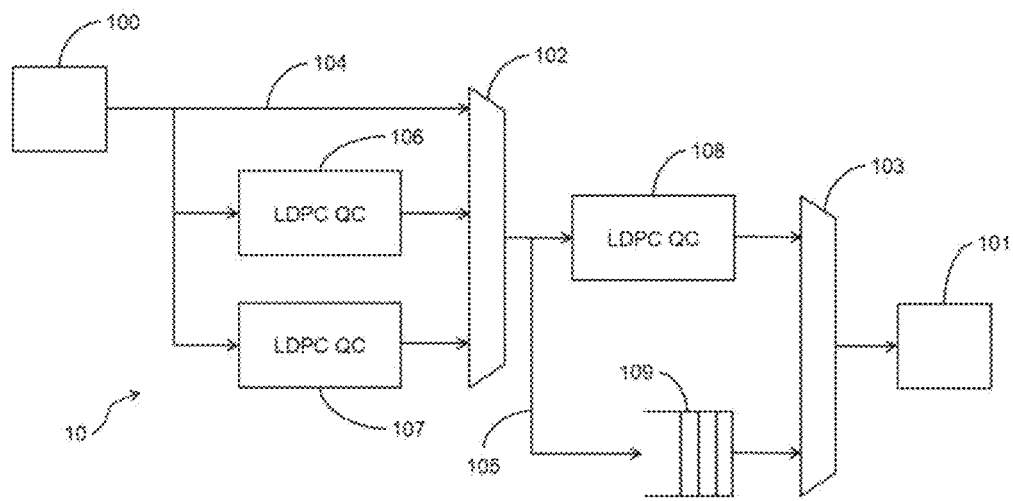
Figure 4:
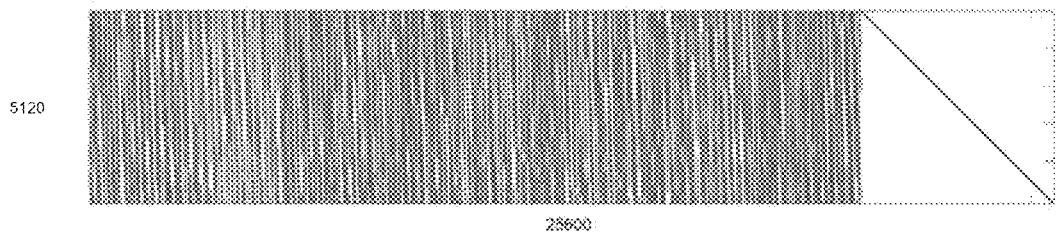
Figure 5:
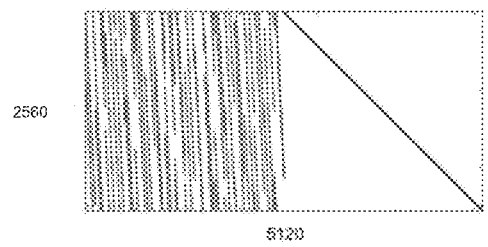
Figure 6:
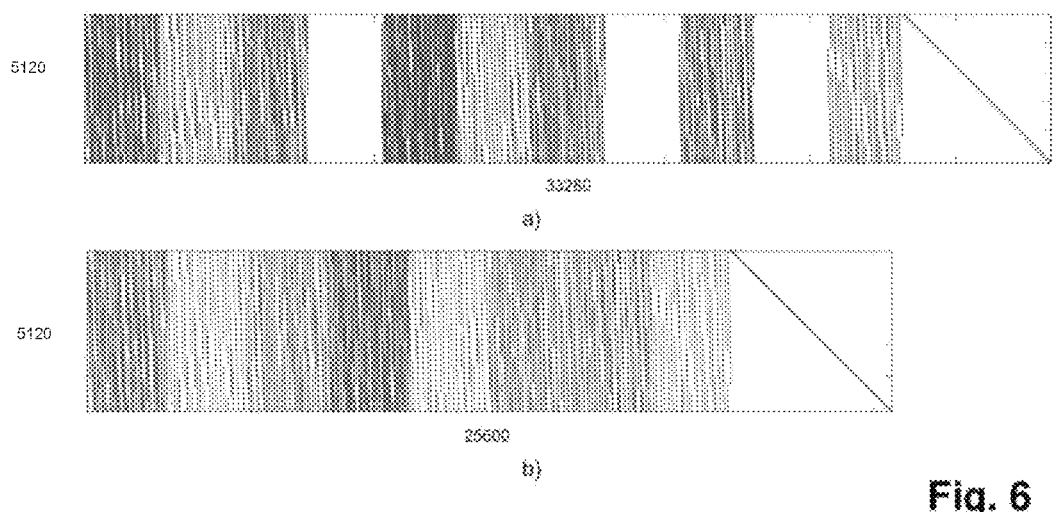
Figure 7:
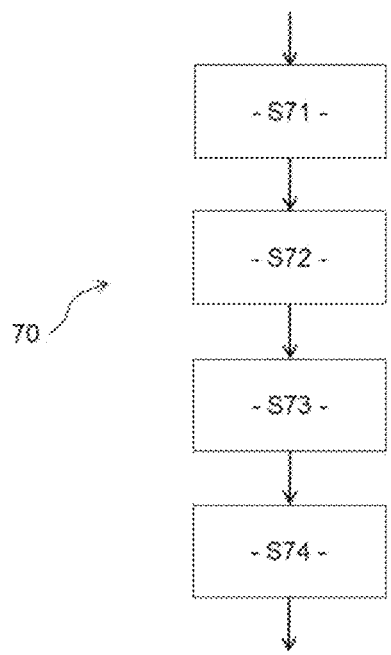
Figure 8:
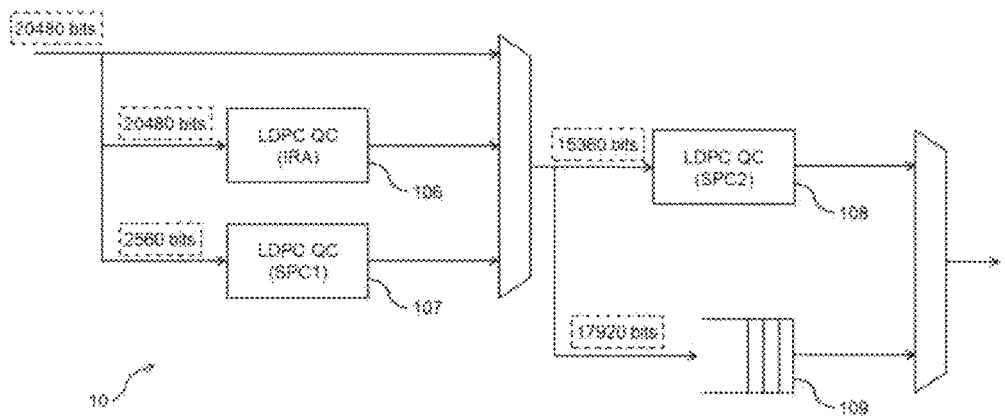
Figure 9:
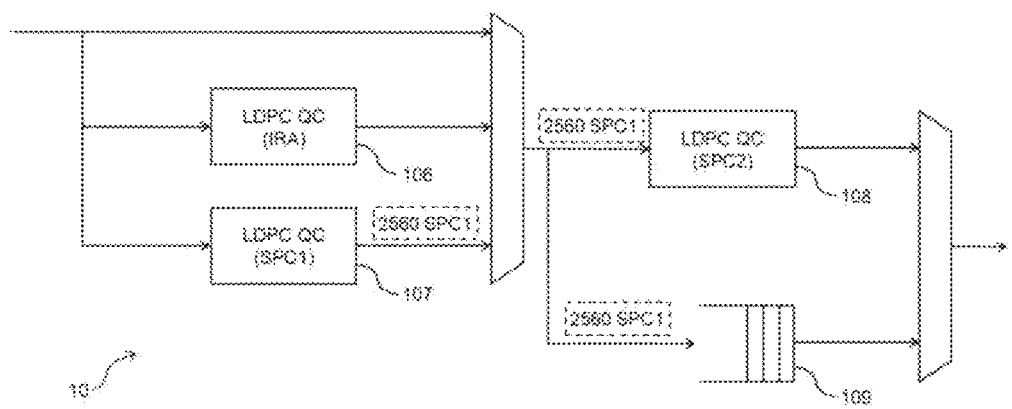
Figure 10:
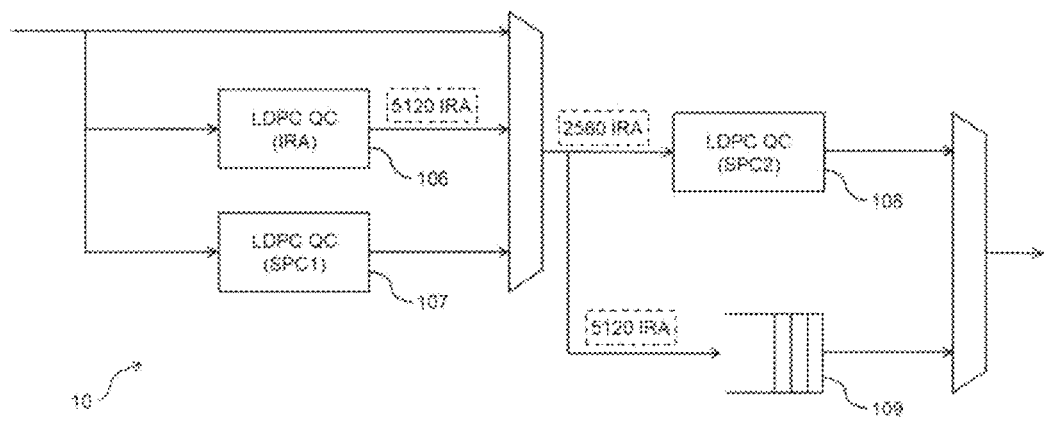
Figure 11:
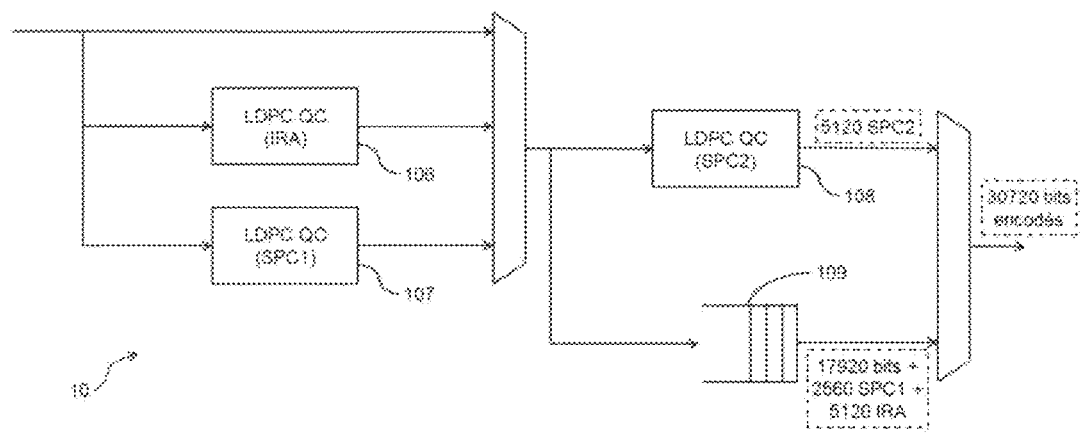

The invention will be better understood upon reading the following description, given as a non-limiting example, and made with reference to the figures which show:

FIG. 1: a schematic representation of an exemplary embodiment of an encoding device for LDPC code, FIG. 2: a schematic representation of an exemplary embodiment of an encoding circuit for encoding quasi-cyclic LDPC code, FIG. 3: a schematic representation of a preferred embodiment of an encoding device for LDPC code, FIG. 4: a schematic representation of an exemplary encoding matrix for an LDPC IRA code, FIG. 5: a schematic representation of an exemplary encoding matrix for a first LDPC SPC code, FIG. 6: a schematic representation of an exemplary encoding matrix for a second LDPC SPC code, FIG. 7: a diagram illustrating the main steps of an exemplary implementation of a method for encoding LDPC code, FIG. 8: a schematic representation illustrating the implementation of a step of the encoding method of FIG. 7, FIG. 9: a schematic representation illustrating the implementation of a step of the encoding method of FIG. 7, FIG. 10: a schematic representation illustrating the implementation of a step of the encoding method of FIG. 7, FIG. 11: a schematic representation illustrating the implementation of a step of the encoding method of FIG. 7.

In these figures, identical references from one figure to another designate identical or similar elements. For clarity, the items shown are not to scale unless otherwise noted.

DESCRIPTION OF EMBODIMENTS

FIG. 1 schematically represents one particular embodiment of an encoding device 10 suitable for encoding a plurality of LDPC codes.

Encoding device 10 comprises, for example, one or more programmable logic devices of a type such as FPGA, PLD, etc., and/or one or more application-specific integrated circuits (ASIC) configured to carry out the various processing operations for encoding LDPC codes. In the case of space applications targeting transmission rates on the order of several Gbit/s, encoding device 10 is for example implemented by an ASIC or by an FPGA type of programmable logic device (for example the Xilinx® KU060 model).

As illustrated by FIG. 1, encoding device 10 comprises an input interface 100, for receiving data to be encoded from a data packet, and an output interface 101, for supplying encoded data obtained from the data received at input interface 100. According to one non-limiting example, input interface 100 and output interface 101 allow implementing the AXI4 ("Advanced eXtensible Interface-4") interface protocol or one derived from said AXI4 interface protocol. However, any type of interface protocol compatible with the desired transmission rate can be considered for input interface 100 and output interface 101, which furthermore may use different interface protocols.

In addition, encoding device 10 comprises a first multiplexer circuit 102 and a second multiplexer circuit 103.

As illustrated by FIG. 1, the input of first multiplexer circuit 102 is connected, by a connection 104, to input interface 100 of encoding device 10. The output of first multiplexer circuit 102 is connected as well, by a connection 105, to the input of second multiplexer circuit 103. The output of second multiplexer circuit 103 is further connected to output interface 101 of encoding device 10. Thus, output interface 101 is connected to input interface 100 by means of first multiplexer circuit 102 and second multiplexer circuit 103, via connections 104 and 105, and this path makes it possible in particular to provide data at output interface 101 which are included in the LDPC code words identically to what they were before (systematic bits of the LDPC code words).

As illustrated by FIG. 1, encoding device 10 comprises, arranged in parallel to each other and to connection 104, a first encoding circuit 106 for encoding quasi-cyclic LDPC code and a second encoding circuit 107 for encoding quasi-cyclic LDPC code. There are thus three parallel paths between input interface 100 and first multiplexer circuit 102, respectively via connection 104, first encoding circuit 106, and second encoding circuit 107.

Encoding device 10 also comprises, arranged in parallel with connection 105, a third encoding circuit 108 for encoding quasi-cyclic LDPC code. There are thus two parallel paths between first multiplexer circuit 102 and second multiplexer circuit 103, respectively via connection 105 and third encoding circuit 108.

As indicated above, encoding device 10 comprises three encoding circuits 106, 107, 108 for encoding quasi-cyclic LDPC codes. Quasi-cyclic LDPC codes are known to enable efficient encoding by parallelizing many processing operations. For such quasi-cyclic LDPC codes, a lifting size Z (or circulant size) is generally defined, which corresponds to the maximum size of the blocks that can be processed in parallel per circulant row. For example, in the case of certain LDPC codes proposed for the standard defined by the CCSDS, the lifting size is equal to Z=128, and the size of the LDPC code words is constant regardless of the type of LDPC code considered or the code rate considered: equal to 30720 bits. The fact that a constant LDPC code word size is taken into account, for example equal to 30720 bits, makes it possible to size the processing operations homogeneously for all code rates.

As indicated above, many possible architectures exist in the literature for the implementation of such quasi-cyclic LDPC codes. FIG. 2 schematically represents a non-limiting example of an architecture that can be used for each of encoding circuits 106, 107, 108 for encoding quasi-cyclic LDPC codes, of encoding device 10. In the example illustrated by FIG. 2, encoding circuit 106, 107, 108 comprises:

- an input buffer 201 of the first-in-first-out type,
- an input alignment unit 202, which makes it possible to form blocks of data bits to be encoded, that are the size of the lifting factor Z,
- a volatile or non-volatile memory 203 ("Random Access Memory" or RAM, "Read-Only Memory" or ROM) in which is stored configuration information relating to one or more supported LDPC codes, for example such as the encoding matrices to be used (which may be stored in any suitable form), or the number and positions of any bits to be punctured, the number and positions of systematic bits, the number and positions of parity bits, etc.,
- volatile memories 204 and 205, respectively for storing blocks of bits before encoding and blocks of parity bits, that are the size of the lifting factor Z,
- a processing kernel 206 to perform the various encoding processing operations, based mainly on XOR-type logic gates,
- an output volatile memory 207, for temporarily storing the blocks of encoded data bits that are the size of the lifting factor Z,
- an output alignment unit 208, which adapts the size of the blocks of encoded data bits to the size expected as output from encoding circuit 106, 107, 108.

Of course, there are other architectures that can be used for each of encoding circuits 106, 107, 108 for encoding quasi-cyclic LDPC codes, and the choice of a particular architecture is only one variant implementation of the invention.

In the example illustrated by FIG. 2, the configuration information is stored in volatile or non-volatile memory 203 internal to encoding circuit 106, 107, 108. However, in other examples, nothing excludes considering other configurations for storing configuration information. For example, it is possible to group together the configuration information of the three encoding circuits 106, 107, 108 for encoding quasi-cyclic LDPC codes, into a single volatile or non-volatile memory shared by said three encoding circuits 106, 107, 108.

In the case where encoding device 10 is implemented at least in part in an FPGA programmable logic device, the configuration information is for example stored in one or more volatile memories of said FPGA into which the content is loaded upon initialization of said FPGA, from one or more non-volatile memories which may be internal or external to encoding device 10. Where appropriate, the non-volatile memory or memories preferably also store the configuration program product used to configure said FPGA.

Due to its particular architecture, encoding device 10 comprises many possible paths for the data bits to be encoded and/or for the encoded data bits. Thus, data bits corresponding to systematic bits can be sent from input interface 100 to the output interface via connections 104 and 105. Data bits to be encoded can be sent directly to third encoding circuit 108, via connection 104, without first traveling through first encoding circuit 106 or second encoding circuit 107. Data bits encoded by first encoding circuit 106 and/or by second encoding circuit 107 can be sent to third encoding circuit 108 or to output interface 101 (via connection 105), etc.

In addition, many particular types of LDPC codes correspond to quasi-cyclic LDPC codes and/or to juxtapositions and/or combinations of quasi-cyclic LDPC codes (SPC, IRA, ARA, etc.), and it is understood that such an architecture of encoding device 10 allows forming many different types of LDPC codes, by means of suitable configurations of the three encoding circuits 106, 107, 108.

Each of the three encoding circuits 106, 107, 108 for encoding LDPC codes can be configured to form different LDPC codes, corresponding for example to different types of LDPC codes and/or to different code rates for a same type of LDPC code. For example, it is possible to store several encoding matrices for a same encoding circuit 106, 107, 108, which can be used at different times depending on the LDPC code selected and implemented at a given time by encoding device 10.

Such an encoding device 10 makes it possible in particular to form the different types of LDPC codes envisaged for the standard defined by the CCSDS, which comprise LDPC ARA codes juxtaposing LDPC IRA and SPC codes in parallel, but also LDPC codes combining LDPC ARA and SPC codes in series.

FIG. 3 schematically represents a preferred embodiment of encoding device 10. As illustrated by FIG. 3, encoding device 10 comprises, in addition to the elements described with reference to FIG. 1, a buffer memory 109, for example of the FIFO type, arranged on connection 105 between first multiplexer circuit 102 and second multiplexer circuit 103. Due to buffer memory 109, the writing of LDPC code words to output interface 101 of the encoding device is more efficient. In fact, it is possible to gradually group together bits of encoded data (systematic bits and/or parity bits) in buffer memory 109. Memory transfers to output interface 101 can thus be performed by transferring blocks of encoded data bits in burst mode in order to optimize use of the output interface bandwidth ("burst accesses").

In the rest of the description, it is considered in a non-limiting manner that:

- first encoding circuit 106 is configured to form one or more LDPC IRA codes; to this end, the configuration information of first encoding circuit 106 comprises at least one encoding matrix for LDPC IRA code,
- second encoding circuit 107 is configured to form one or more LDPC SPC codes; to this end, the configuration information of second encoding circuit 107 comprises at least one encoding matrix for LDPC SPC code,
- third encoding circuit 108 is configured to form one or more LDPC SPC codes; to this end, the configuration information of third encoding circuit 108 comprises at least one encoding matrix for LDPC SPC code.

With such a configuration of the three encoding circuits 106, 107, 108 for encoding quasi-cyclic LDPC codes, encoding device 10 can in particular encode LDPC codes whose parity matrix H can be put in the following form:

$$H = \begin{pmatrix} A & 0 & D & 0 \\ B & E & 0 & 0 \\ C' & C'' & C''' & F \end{pmatrix}$$ [Math. 1]

an expression in which matrices E and F are diagonal matrices (identity matrix), and matrix D is a dual diagonal matrix (possibly incomplete in that the values of the two diagonals are not necessarily all non-zero, but all values outside the two diagonals are zero). Matrices A, B and C=(C' C" C'") are matrices respectively supplementing matrices D, E and F to form quasi-cyclic LDPC code parity matrices. Such a parity matrix H corresponds for example to the case of an LDPC code combining LDPC SPC and ARA codes in series, the ARA code itself being a juxtaposition of LDPC IRA and SPC codes in series. In preferred embodiments, matrix B can be put in the form B=(B' 0) or B=(0 B'), in order to limit the number of associated calculations.

With such a configuration of the three encoding circuits 106, 107, 108 for encoding quasi-cyclic LDPC codes, encoding device 10 can also encode LDPC codes whose parity matrix H can be put in the following form:

$$H = \begin{pmatrix} A & 0 & D \\ B & E & 0 \end{pmatrix}$$ [Math. 2]

an expression in which what was said in reference to expression [Math. 1] about matrices A, B, D and E is also valid for expression [Math. 2], but the matrices not necessarily being the same. Such a parity matrix H corresponds for example to the case of an LDPC ARA code juxtaposing LDPC IRA and SPC codes in series.

With such a configuration of the three encoding circuits 106, 107, 108 for encoding quasi-cyclic LDPC codes, encoding device 10 can also encode LDPC codes whose parity matrix H can be put in the following form:

$$H=(A\ D)$$ [Math. 3]

an expression in which what was said in reference to expression [Math. 1] about matrices A and D is also valid for expression [Math. 3], but the matrices not necessarily being the same. Such a parity matrix H corresponds for example to the case of an LDPC IRA code.

The parity matrices given by expressions [Math. 1] and [Math. 2] are advantageous in that they allow performing a simple encoding of the various quasi-cyclic LPDC codes of the three encoding circuits 106, 107, 108. One example of an implementation of the various quasi-cyclic LDPC codes in the case of an LDPC code whose parity matrix can be put in the form given by expression [Math. 1] is described below, and further considering, by way of example, that B=(B' 0).

In practice, one can consider that:
matrix $H^{IRA}$=(A D) corresponds to the parity matrix of an LDPC IRA code,
matrix $H^{SPC1}$=(B' E) corresponds to the parity matrix of an LDPC SPC code implemented by second encoding circuit 107, referred to as LDPC SPC1 code,
matrix $H^{SPC2}$=(C F) corresponds to the parity matrix of an LDPC SPC code implemented by third encoding circuit 108, referred to as LDPC SPC2 code.

We consider that matrix $H^{IRA}$ has dimensions $m_A \cdot Z \times n_A \cdot Z$, that matrix $H^{SPC1}$ has dimensions $m_B \cdot Z \times n_B \cdot Z$, and that matrix $H^{SPC2}$ has dimensions $m_C \cdot Z \times n_C \cdot Z$. In order to facilitate implementation, parity matrices $H^{IRA}$, $H^{SPC1}$ and $H^{SPC2}$ are transformed by means of a permutation matrix $\Pi_X$ of dimensions $m_X \cdot Z \times m_X \cdot Z$ which performs row-column interleaving such that each row $m \cdot n_X+n$ of a matrix $X \in \{A, B, C\}$ becomes row $n \cdot m_X+m$ in matrice $\Pi_X^T \cdot X$. We can thus calculate matrices $H'^{IRA}$, $H'^{SPC1}$ and $H'^{SPC2}$ to be used for encoding (compatible with the form described in [RiShUr]), such that:

[Math. 4]

$$H'^{IRA}=[\Pi_A^T \cdot D \cdot \Pi_A]$$

$$H'^{SPC1}=[\Pi_B^T \cdot B'|\Pi_B^T \cdot E \cdot \Pi_B]$$

$$H'^{SPC2}=[\Pi_C^T \cdot C|\Pi_C^T \cdot F \cdot \Pi_C]$$

Since matrices E and F correspond to the identity matrix, we have $\Pi_B^T \cdot E \cdot \Pi_B = E$ and $\Pi_C^T \cdot F \cdot \Pi_C = F$.

The row vector of data bits to be encoded is denoted u, and the row vector of parity bits is denoted p. According to the form of the parity matrix H given by expression [Math. 1], it can be seen that vector p can be decomposed as follows:

$$p=[p^{SPC1}|p^{IRA}|p^{SPC2}]$$ [Math. 5]

Also, it can be seen from the form of matrix B=(B' 0) that the LPDC SPC1 code only takes into account part of the data bits to be encoded, so it is possible to decompose vector u as follows:

$$u=[u^{SPC1}|u']$$ [Math. 6]

an expression in which vector $u^{SPC1}$ comprises the data bits to be encoded which are used by the LDPC SPC1 code.

By designating as $y^{SPC1}=[u^{SPC1}|p^{SPC1}]$, and given that:

$$H'^{SPC1} \cdot (y^{SPC1})^T = 0$$ [Math. 7]

then we deduce that the parity bits $p^{SPC1}$ can be obtained by calculating the following expression:

$$p^{SPC1} = \Pi_B^T \cdot B' \cdot (u^{SPC1})^T$$ [Math. 8]

By designating as $u^{IRA}$ the row vector comprising the bits of vector u which are used by the LDPC IRA code, then the encoding of the LDPC IRA code to obtain vector $p^{IRA}$ can be carried out in a conventional manner according to the following expression:

$$p_l^{IRA} = \sum_{j=1}^{n_A-m_A} H'^{IRA}_{l,j} \cdot u_j^{IRA} + \sum_{j=1}^{l-1} H'^{IRA}_{l,j+n_A-m_A} \cdot p_j^{IRA}$$ [Math. 9]

Once vectors $p^{SPC1}$ and $p^{IRA}$ have been calculated, the data bits supplied as input to the LDPC SPC2 code (third encoding circuit 108) correspond to a vector $u^{SPC2}=[u|p^{SPC1}|p^{IRA}]$. Since matrix F corresponds to the identity matrix, vector $p^{SPC2}$ can be calculated according to the following expression:

$$p^{SPC2}=\Pi_C^T \cdot C \cdot (u^{SPC2})^T$$ [Math. 10]

The final LDPC code word formed, designated as $y^{LDPC}$, is for example given by the following expression:

$$y^{LDPC}=[u|p^{SPC1}|p^{IRA}|p^{SPC2}]$$ [Math. 11]

FIGS. 4, 5, and 6 show matrices $H'^{IRA}$, $H'^{SPC1}$ and $H'^{SPC2}$ which can be stored as encoding matrices for encoding an LDPC code combining LDPC ARA and SPC codes in series, the LDPC ARA code itself being obtained by the juxtaposition of LDPC IRA and SPC codes in parallel. In these figures, the black areas correspond to non-zero values, while the white areas correspond to zero values.

In the example illustrated by FIGS. 4 to 6, the LPDC code obtained has a code rate equal to ⅔, and a code word size equal to 30720 bits (obtained from a data packet comprising 20480 bits of data to encode). More particularly:

FIG. 4 schematically represents an example matrix $H'^{IRA}$ of dimensions 5120×25600, FIG. 5 schematically represents an example matrix $H'^{SPC1}$ of dimensions 2560×5120, part a) of FIG. 6 schematically represents an example matrix $H'^{SPC2}$ of dimensions 5120×33280; however, note that this matrix $H'^{SPC2}$ has many adjacent columns composed of zero values; preferably, the adjacent columns (or adjacent rows if considering for example the transposed matrix) composed of zero values are not stored in order to reduce the memory footprint and speed up the encoding, and part b) of FIG. 6 represents the stored matrix $H'^{SPC2}$, of dimensions 5120×25600.

FIG. 7 represents the main steps of an encoding method 70 in the case of an LDPC code requiring the use of the three encoding circuits 106, 107, 108, first encoding circuit 106 and second encoding circuit 107 being used in parallel with each other, and in series with third encoding circuit 108.

As illustrated by FIG. 7, encoding method 70 comprises in particular:
- a step S71 of writing, in parallel, data of a data packet to be encoded, into respective input buffer memories of first encoding circuit 106, second encoding circuit 107, and third encoding circuit 108,
- a step S72 of encoding the data in the input buffer memory, in parallel, by first encoding circuit 106 and second encoding circuit 107,
- a step S73 of writing data respectively encoded by first encoding circuit 106 and second encoding circuit 107, into the input buffer memory of third encoding circuit 108,
- a step S74 of encoding the data in the input buffer memory, by third encoding circuit 108.

In addition to these main steps, other steps may be implemented, for example to write the systematic bits into buffer memory 109 (or directly to output interface 101 in the case of encoding device 10 of FIG. 1), and/or to write parity bits supplied by first encoding circuit 106 and/or by second encoding circuit 107, to be included in the LDPC code word, into buffer memory 109 (or directly to output interface 101).

An exemplary implementation of encoding method 70 is now described, in the case of the encoding device of FIG. 3, to encode an LDPC code combining LDPC ARA and SPC codes in series, the LDPC ARA code itself being obtained by the juxtaposition of LDPC IRA and SPC codes in parallel. In this example, in a non-limiting manner, the case is considered where the LPDC code obtained has a code rate equal to ⅔, and a code word size equal to 30720 bits (obtained from a data packet comprising 20480 bits of data to be encoded), using for example matrices $H'^{IRA}$, $H'^{SPC1}$ and $H'^{SPC2}$ shown in FIGS. 4 to 6.

FIG. 8 illustrates write step S71. As illustrated by FIG. 8, the 20480 bits of data to be encoded are written into the input buffer memory of first encoding circuit 106. Only 2560 bits of data to be encoded are written into the input buffer memory of second encoding circuit 107, and only 15360 bits of data to be encoded are written into the input buffer memory of third encoding circuit 108. In addition, the systematic bits, of which there are 17920 after puncturing, are written into buffer memory 109 between first multiplexer circuit 102 and second multiplexer circuit 103.

FIGS. 9 and 10 illustrate encoding step S72 and the step S73 of writing into the input buffer memory of third encoding circuit 108. As illustrated by FIG. 9, the encoding by second encoding circuit 107 completes first, and produces 2560 parity bits, denoted SPC1. The 2560 SPC1 parity bits are written both into the input buffer memory of third encoding circuit 108 and into buffer memory 109 between first multiplexer circuit 102 and second multiplexer circuit 103, after the 17920 systematic bits. As shown in FIG. 10, encoding by first encoding circuit 106 completes second, and produces 5120 parity bits, denoted IRA. Only 2560 IRA parity bits are written into the input buffer memory of third encoding circuit 108. The 5120 IRA parity bits are written into buffer memory 109 between first multiplexer circuit 102 and second multiplexer circuit 103, after the 2560 SPC1 parity bits.

FIG. 11 illustrates encoding step S74 by third encoding circuit 108. As illustrated by FIG. 11, the encoding by third encoding circuit 108 produces 5120 parity bits, denoted SPC2, from the 15360 data bits, the 2560 SPC1 parity bits, and the 2560 IRA parity bits stored in the input buffer memory of third encoding circuit 108. At the end of encoding step S74 by third encoding circuit 108, the generated LDPC code word can be provided at output interface 101, by writing to said interface the systematic bits (17920), the SPC1 parity bits (2560), and the IRA parity bits (5120) stored in buffer memory 109, then the SPC2 parity bits (5120) supplied by third encoding circuit 108, thus forming the final LDPC code word comprising 30720 bits of encoded data.

Thus, proposed encoding device 10 makes it possible to optimize the processing operations, in particular by the possibility of carrying out numerous write accesses in parallel (into the respective input buffer memories of the three encoding circuits 106, 107, 108, and possibly into buffer memory 109), but also by the fact that certain encoding processing operations are carried out in parallel (by first and second encoding circuits 106, 107).

In preferred embodiments of encoding device 10, the input buffer memory of third encoding circuit 108 is of a size suitable for storing data corresponding to at least two data packets to be encoded. In the case of encoding device 10 of FIG. 3, buffer memory 109 between first multiplexer circuit 102 and second multiplexer circuit 103 is also of a size suitable for storing data corresponding to at least two data packets to be encoded. Such arrangements are advantageous in that they also allow parallelizing the encoding processing operations carried out by third encoding circuit 108 with those carried out by first and second encoding circuits 106, 107. Indeed, after the data bits encoded by first and second encoding circuits 106, 107 have been written into the input buffer of third encoding circuit 108 (and into buffer 109), the data bits of a new data packet to be encoded can be written into the input buffers of the three encoding circuits 106, 107, 108, and can begin to be encoded by first and second encoding circuits 106, 107 before third encoding circuit 108 has finished encoding the data bits of the previous data packet.

What has been described with reference to FIGS. 7 to 11 corresponds to an advantageous use of encoding device 10 in the case of implementing an LDPC code using the three encoding circuits 106, 107, 108, which corresponds to the most restrictive case for obtaining high transmission rates. In the case where the LDPC code considered does not require the use of third encoding circuit 108, for example to encode an LDPC ARA code (by means of a juxtaposition of LDPC IRA and SPC codes in parallel), it is possible to write the SPC1 parity bits and the IRA parity bits directly after the systematic bits to buffer memory 109 (or directly to output interface 101 in the case of encoding device 10 of FIG. 1), without using third encoding circuit 108. It is also possible to encode an LDPC IRA code by directly writing the IRA parity bits after the systematic bits to buffer memory 109 (or directly to the output interface 101), without using second encoding circuit 107 and without using third encoding circuit 108, etc.

Through its various features and their advantages, encoding device 10 achieves the set objectives. In particular, encoding device 10 can flexibly encode different LDPC codes, using different configurations, in particular for the three encoding circuits 106, 107, 108 for encoding quasi-cyclic LDPC codes. In addition, proposed encoding device 10 is compatible with high transmission rates, on the order of 10 Gbit/s. In particular, the inventors have implemented the LDPC codes proposed for the standard defined by the CCSDS on a Xilinx® KU060 FPGA programmable logic device, and have found that the expected transmission rate (10 Gbit/s/s) was achieved using a clock frequency of 400 MHz, by implementing a single encoding device 10 on the FPGA as described with reference to FIG. 3. By using a clock frequency of 200 MHz, the transmission rate of 10 Gbit/s is achieved by implementing two encoding devices 10 on the same Xilinx® KU060 FPGA, these two encoding devices 10 performing parallel processing. Implementing two encoding devices on a single Xilinx® KU060 FPGA requires less than 5% of the resources of said Xilinx® KU060 FPGA.

Proposed encoding device 10 can be implemented to encode data on board a satellite, and the encoded data can be transmitted to a ground station or to another satellite. The encoded data can be transmitted via an optical link (in particular for a transmission rate of 10 Gbit/s/s) or via a radioelectric link (in the case of lower transmission rates, for example on the order of 1 Gbit/s/s).

More generally, it should be noted that the modes of implementation and embodiments considered above have been described as non-limiting examples, and other variants are therefore conceivable.

In particular, the invention has been described primarily considering an encoding device 10 to be carried on board a satellite in Earth orbit. However, in other examples, nothing excludes using encoding device 10 in terrestrial communication systems.

Furthermore, the invention has been described primarily considering an encoding device 10 comprising three encoding circuits 106, 107, 108 for encoding quasi-cyclic LDPC codes. However, in other examples, nothing excludes considering a larger number of encoding circuits for encoding quasi-cyclic LDPC codes. But an encoding device 10 comprising exactly three encoding circuits 106, 107, 108 for encoding quasi-cyclic LDPC codes corresponds to a preferred embodiment, advantageous in particular from a point of view of compromise between offered flexibility (high) and associated memory footprint (limited).

REFERENCES

[Foss] M. P. C. Fossorier, "Quasicyclic low-density parity-check codes from circulant permutation matrices", IEEE Transactions on Information Theory, volume 50, No. 8, pages 1788-1793, August 2004.

[RiShUr] T. J. Richardson, M. A. Shokrollahi and R. L. Urbanke, "Design of capacity-approaching irregular low-density parity-check codes", IEEE Transactions on Information Theory, volume 47, No. 2, pages 619-637, February 2001.

The invention claimed is:

1. A data encoding device suitable for encoding a plurality of low-density parity-check codes, referred to as LDPC codes, said data encoding device comprising an input interface for receiving data of a data packet to be encoded and an output interface for providing encoded data, said data encoding device comprising:
    a first multiplexer circuit and a second multiplexer circuit, said first multiplexer circuit being connected to the input interface and to the input of said second multiplexer circuit, said second multiplexer circuit being connected to the output interface,
    a first encoding circuit for encoding quasi-cyclic LDPC code, connected at an input to the input interface and at an output to the input of the first multiplexer circuit,
    a second encoding circuit for encoding quasi-cyclic LDPC code, connected at an input to the input interface and at an output to the input of the first multiplexer circuit, said second encoding circuit being arranged in parallel with said first encoding circuit,
    a third encoding circuit for encoding quasi-cyclic LDPC code, connected at an input to the output of the first multiplexer circuit and at an output to the input of the second multiplexer circuit.

2. The data encoding device according to claim 1, comprising at least one memory in which is stored configuration information comprising:
    at least one encoding matrix for LDPC code with irregular repetition-accumulation, referred to as LDPC IRA code, for configuring the first encoding circuit,
    at least one encoding matrix for LDPC code with simple parity check, referred to as LDPC SPC code, for configuring the second encoding circuit,
    at least one encoding matrix for LDPC SPC code, for configuring the third encoding circuit.

3. The data encoding device according to claim 2, wherein at least one encoding matrix for LDPC code is partially stored, by not storing adjacent rows or columns of said encoding matrix for LDPC code which consist of zero values.

4. The data encoding device according to claim 1, wherein the third encoding circuit comprises an input buffer of a size suitable for storing data corresponding to at least two data packets to be encoded.

5. The data encoding device according to claim 1, wherein the first multiplexer circuit is connected to the second multiplexer circuit via a buffer memory.

6. The data encoding device according to claim 5, wherein the buffer memory between the first multiplexer circuit and the second multiplexer circuit is of a size suitable for storing data corresponding to at least two data packets to be encoded.

7. The data encoding device according to claim 1, configured to encode LDPC codes whose parity matrix H can be put in the following form:

$$H = \begin{pmatrix} A & 0 & D \\ B & E & 0 \end{pmatrix}$$

or in the following form:

$$H = \begin{pmatrix} A & 0 & D & 0 \\ B & E & 0 & 0 \\ C' & C'' & C''' & F \end{pmatrix}$$

expressions in which matrices E and F are diagonal matrices, and matrix D is a dual diagonal matrix.

8. The data encoding device according to claim 1, configured to encode LDPC codes whose parity matrix H can be put in the following form:

$$H = (A\ D)$$

or in the following form:

$$H = \begin{pmatrix} A & 0 & D \\ B & E & 0 \end{pmatrix}$$

or in the following form:

$$H = \begin{pmatrix} A & 0 & D & 0 \\ B & E & 0 & 0 \\ C' & C'' & C''' & F \end{pmatrix}$$

expressions in which matrices E and F are diagonal matrices, and matrix D is a dual diagonal matrix.

9. A satellite comprising the data encoding device according to claim 1.

10. The satellite according to claim 9, wherein the encoded data are transmitted over an optical link.

11. The satellite according to claim 9, wherein the encoded data are transmitted at a rate greater than 5 Gbit/s.

12. A method for encoding low-density parity-check codes, referred to as LDPC codes, by means of the data encoding device according to claim 1, comprising:
- writing, in parallel, data of a data packet to be encoded, into respective input buffer memories of the first encoding circuit, second encoding circuit, and third encoding circuit,
- encoding, in parallel, data in the input buffer memory, by the first encoding circuit and the second encoding circuit,
- writing data respectively encoded by the first encoding circuit and/or the second encoding circuit, into the input buffer memory of the third encoding circuit,
- encoding the data in the input buffer memory, by the third encoding circuit.

13. The encoding method according to claim 12, comprising, in parallel with the encoding by the third encoding circuit, a writing, in parallel, of data of another data packet to be encoded, into the respective input buffer memories of the first encoding circuit, second encoding circuit, and third encoding circuit.

14. The encoding method according to claim 12, wherein, the data encoding device comprising a buffer memory between the first multiplexer circuit and the second multiplexer circuit, the data of the data packet are written into said buffer memory in parallel with the writing into the respective input buffer memories of the first encoding circuit, second encoding circuit, and third encoding circuit.

15. A configuration program product comprising instructions which, when implemented to configure a programmable logic device, configure said programmable logic device to form the data encoding device according to claim 1.

* * * * *